United States Patent
Antolovic et al.

(10) Patent No.: US 12,249,669 B2
(45) Date of Patent: Mar. 11, 2025

(54) HIGH SENSITIVITY SINGLE-PHOTON AVALANCHE DIODE ARRAY

(71) Applicant: ECOLE POLYTECHNIQUE FEDERALE DE LAUSANNE (EPFL), Lausanne (CH)

(72) Inventors: Michel Ivan Antolovic, Lausanne (CH); Claudio Bruschini, Villars-Sous-Yens (CH); Edoardo Charbon, Jouxtens-Mezery (CH)

(73) Assignee: Ecole Polytechnique Federale De Lausanne, Lausanne (CH)

( * ) Notice: Subject to any disclaimer, the term of this patent is extended or adjusted under 35 U.S.C. 154(b) by 422 days.

(21) Appl. No.: 17/774,045

(22) PCT Filed: Nov. 4, 2019

(86) PCT No.: PCT/EP2019/080135
§ 371 (c)(1),
(2) Date: May 3, 2022

(87) PCT Pub. No.: WO2021/089115
PCT Pub. Date: May 14, 2021

(65) Prior Publication Data
US 2022/0384671 A1    Dec. 1, 2022

(51) Int. Cl.
*H01L 27/146* (2006.01)
*G02B 19/00* (2006.01)
*G02B 21/00* (2006.01)
*H01L 31/107* (2006.01)

(52) U.S. Cl.
CPC ...... *H01L 31/1075* (2013.01); *G02B 19/0076* (2013.01); *G02B 21/008* (2013.01); *H01L 27/14627* (2013.01)

(58) Field of Classification Search
CPC ............... H01L 27/14627; H01L 31/1075
See application file for complete search history.

(56) References Cited

U.S. PATENT DOCUMENTS

| | | |
|---|---|---|
| 2004/0245592 A1 | 12/2004 | Harmon |
| 2015/0226863 A1 | 8/2015 | Kawata |
| 2019/0348457 A1* | 11/2019 | Park .................. H01L 27/14685 |

FOREIGN PATENT DOCUMENTS

WO    2019102605 A1    5/2019

OTHER PUBLICATIONS

International Search Report mailed Jul. 31, 2020, in International application No. PCT/EP2019/080135, 10 pages.
Marco Castello et al., "Image Scanning Microscopy with Single-Photon Detector Array," bioRxiv, Jun. 2, 2018, 21 pages, XP055717311, DOI: 10.1101/335596. Retrieved from the Internet: URL:https://www.biorxiv.org/content/10.1101/335596v1.full.pdf.

* cited by examiner

*Primary Examiner* — Douglas M Menz
(74) *Attorney, Agent, or Firm* — Blueshift IP; Robert Plotkin

(57) ABSTRACT

The present invention relates to a photodetector array for capturing image data, comprising: —photodetector cells arranged on a substrate, each including a single-photon avalanche diode, wherein the active areas of the photodetector cells are neighbored along a hexagonal grid; —microlenses, having a hexagonal or circular shape, each arranged on one photodetector cell to focus light onto the photodiode.

10 Claims, 6 Drawing Sheets

HIGH SENSITIVITY SINGLE-PHOTON AVALANCHE DIODE ARRAY

TECHNICAL FIELD

The present invention relates to photodetector arrays, particularly photodetector arrays with a high sensitivity for microscopy applications. Particularly, the present invention relates to architectures of a photodetector array with an increased fill factor.

TECHNICAL BACKGROUND

For applications such as image scanning microscopy, photodetector arrays with high sensitivity photodiodes are required, as e.g. referred to in C. J. R. Sheppard et al., "Superresolution by image scanning microscopy using pixel reassignment," Opt. Lett., vol. 38, no. 15, p. 2889, August 2013, C. B. Muller et al., "Image Scanning Microscopy," Phys. Rev. Lett., vol. 104, no. 19, p. 198101, May 2010 and J. Huff, "The Airyscan detector from ZEISS: confocal imaging with improved signal-to-noise ratio and super-resolution," Nat. Methods, vol. 12, no. 12, 2015. Image scanning microscopy leads to larger light collection and a resolution improvement of up to a factor of 2. Common photodetector arrays exist, but suffer from readout noise and excess noise. Single-photon avalanche diode (SPAD) arrays enable photon counting without any readout noise, and with integration times below 1 μs. However, SPAD photodetector arrays have been suffering from a low native fill factor, which is defined as the ratio between the active area and the total pixel area. The cause of the low native fill factor is that firstly, each SPAD pixel accommodates a guard ring around the active area to prevent lateral breakdown and, secondly, that each SPAD pixel integrates electronics.

One approach to increase the fill factor is to increase the SPAD active area, while keeping the size of the guard ring and electronics. However, a low active area and a native low native fill factor have multiple benefits, such as low noise, low noise non-uniformity and low crosstalk due to the relatively large distance between the photodiodes.

For applications, such as microscopy, which usually direct almost fully collimated light to the photodetector array, microlenses could be used to recover the low fill factor. Here, microlenses are arranged above each photodiode to direct photons from a larger detection area onto the smaller active area of the photodiode. However, practical limitations restrict the lowering of the native fill factor depending on the microlens uniformity and shape.

In microscopes, light is collected through an objective with a high numerical aperture and then collimated to be projected onto a detector with a focusing tube lens having a low numerical aperture. Therefore, light directed on the photodetector array is almost fully collimated. It is required in microscopy that live cells are exposed to a reduced illumination intensity to reduce phototoxicity and photo-bleaching. This requires a highly sensitive photodetector array which therefore is to be implemented as SPAD array since photon-counting detectors enable Poisson limited signal-to-noise ratio without readout noise.

It is an object of the present invention to provide an improved high sensitivity photodetector array for use in applications such as microscopy with a high effective fill factor, while minimizing the dark count rate, non-uniformity and cross-talk.

SUMMARY OF THE INVENTION

This object has been achieved by the photodetector array according to claim 1 and the microscope system according to the further independent claim.

Further embodiments are indicated in the depending subclaims.

According to a first aspect a photodetector array for capturing image data is provided, comprising:
  photodetector cells arranged on a substrate, each including a single-photon avalanche diode (SPAD), wherein the active areas of the photodetector cells are neighbored along a hexagonal grid; and
  microlenses, having a hexagonal or circular shape, each arranged on one photodetector cell to focus light onto the photodiode.

The above photodetector array provides an architecture where the photodetector cells (regions each associated with a single photodiode/pixel) are arranged according to a hexagonal grid, i.e. in lines with a staggered arrangement. Furthermore, each of the photodetector cells is provided with a microlens increasing the effective active area per pixel.

The relatively small active area of the SPADs enables to have a lower number of very noisy pixels and a lower average dark count rate level. The smaller active area is further beneficial to reduce the capacitance of the single photon avalanche diodes and the charge flow through the photodiodes, thus reducing the cross-talk between the photodiodes. Additionally, the distance between the active areas of neighboring photodiodes is increased, thus increasing the optical absorption between the active areas and reducing the optical crosstalk.

However, while the reduction of the active area of the photodiodes is beneficial with respect to the dark count rate and the cross-talk, it also lowers the sensitivity so that a recovery of the fill factor is required. This is accomplished by using microlenses for each of the photodiodes. However, a rectangular (particularly square in this case) microlens implementation can only achieve a theoretical maximum of 70% and 85% effective fill factor (defined as the native fill factor multiplied by the effectiveness/gain of the microlens), for a 6.7% and 27% native fill factor, respectively. This inefficiency is caused by the focusing quality of spheres accommodated for rectangular base shapes.

As for the rectangular arrangement of conventional photodiode arrays, the microlenses are adapted to the rectangular shape of the photodetector cells and may also have a rectangular shape they only contribute to a much lower fill factor compared to a staggered arrangement. Thus, the low fill factor of the small active area photodiodes cannot be recovered sufficiently with the rectangularly arranged microlenses. To overcome these issues regarding the fill factor the above architecture proposes to use microlenses on photodiode cells arranged in a hexagonal grid with round, hexagonal microlens shape or higher polygonal shapes (higher than hexagonal). The microlenses will thus be also arranged according to the hexagonal grid which increases area coverage of the microlenses. The hexagonal grid enables maximum packing of circular microlenses that yield a high focusing quality with up to 90.6% effective fill factor.

As a further advantage, the circular-shaped microlenses ensure a higher microlens production yield, particularly when processed including thermal reflow.

By applying single photon-avalanche diodes a high sensitivity down to a single photons can be achieved and a Poisson limited signal-to-noise ratio is enabled.

Furthermore, the active area of the SPAD may have a circular shape. This allows reducing the electrical field compare to squared active areas. Moreover, at least one of the microlenses may have a circular shape, wherein the radius of the microlense is by a factor of 3 to 20 larger than the radius of the active area of the photodiode. The circular shape of the microlenses allow an optimized area coverage in the staggered arrangement.

Particularly, the radius of the active area may be lower than 9 μm, preferably lower than 5 μm, wherein particularly the radius of the active area is more than 3 μm. The relatively small size of the active area helps to avoid impurities, which are a main cause of the generation of noise.

According to an embodiment, the active area of the photodiode may be configured with an area of 5-33% of the area of the photodetector cell.

Furthermore, the microlenses may be formed/printed on the substrate with a ratio between a sag height and a residual height of between 0.05 and 0.9.

It may be provided that each of the photodetector cells is coupled with an individual read-out line for reading out a pixel data.

Particularly, the read-out lines may be arranged straight along an arrangement direction of the photodetector cells between neighboring rows of photodetector cells. Compared to the serpentine read-out lines, the straight lines reduce the parasitic capacitance and resistance.

Furthermore, the power lines may extend perpendicular to the read-out lines and run in a serpentine manner around the active areas of the photodetector cells.

According to a further aspect a microscopic system with an optical system and the above photodetector array is provided.

Furthermore, the microscopic system may use an image scanning microscopy approach.

According to an embodiment the microscopic system may place a photodetector array according to claim 1 at the pinhole plane of the microscopic system.

BRIEF DESCRIPTION OF THE DRAWINGS

Embodiments are described in detail in conjunction with the accompanying drawings, in which.

DESCRIPTION OF EMBODIMENTS

Figure 1:
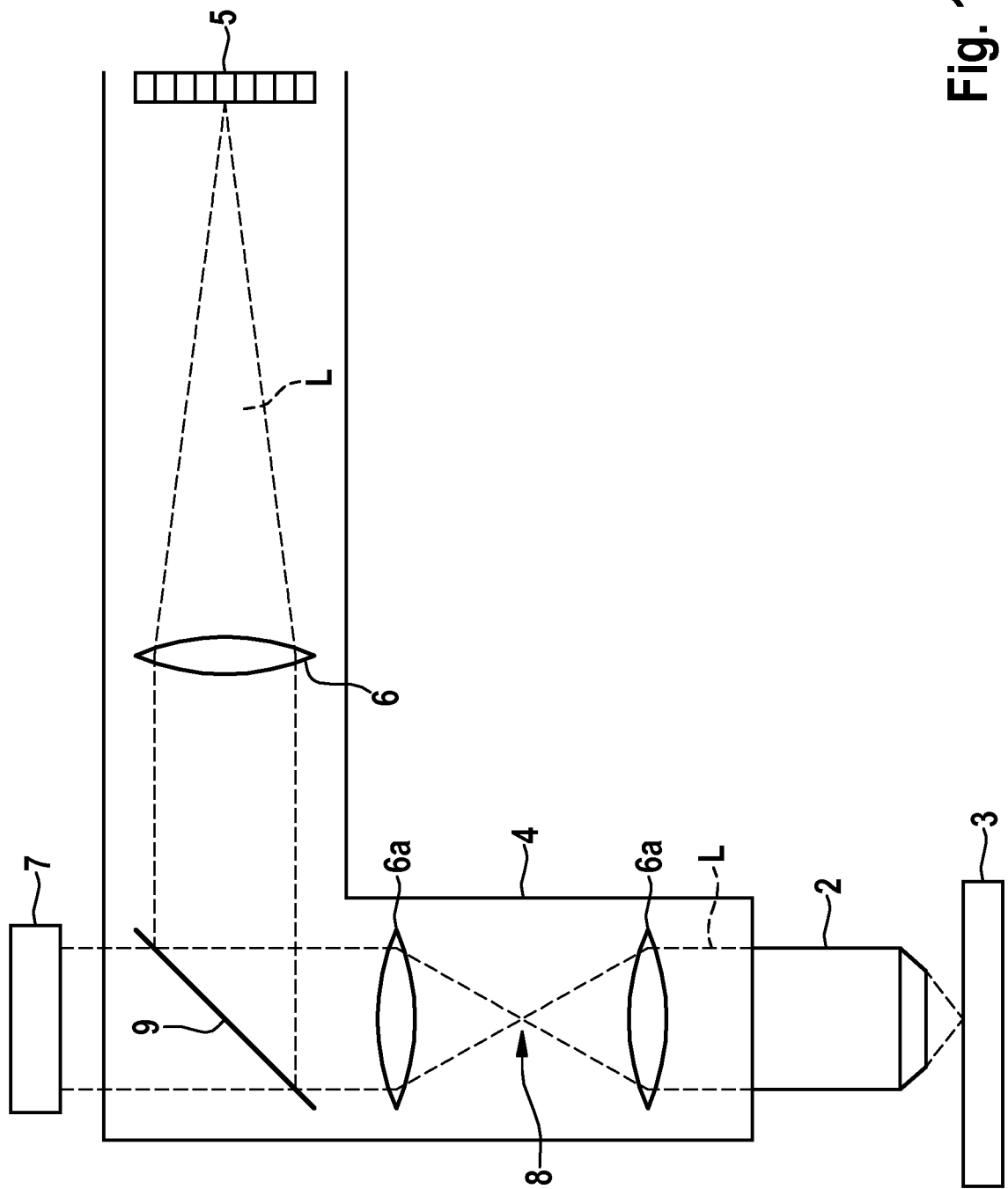
FIG. 1 schematically shows a microscope system using a photodetector array.

FIG. 1 schematically shows a microscopic system 1 as an exemplary application for a photodetector array. The microscopic system 1 has an optical objective 2 with a high numerical aperture to collimate light from a sample 3 into the microscope body 4. The collimated light L is projected onto a photodetector array 5 by means of a focusing tube lense 6 having a low numerical aperture. Further lenses 6a are included to cross light L on a pinhole 8. Illumination is made by an illumination device 7 which couples illumination light in onto the sample 3 by means of a semitransparent mirror 9.

For microscopy applications, a high sensitivity is required with a low noise, a low dark count rate, a high dark count rate uniformity and a low cross-talk between the neighboring pixels. For image-scanning microscopy which enables a theoretical image resolution improvement by a factor of 2 and an improved light collection, a fast photo-counting photodetector array with less than 1 μs integration time is required.

As the illumination intensity has to be restricted to reduce phototoxicity and photobleaching, a very sensitive detector array 5 is required. The most sensitive photodetector arrays use as photodiodes single-photon avalanche diodes, which have a photon counting ability and a high signal-to-noise ratio.

In the following, the photodetector array 5 is described using photodetector cells each provided with a single-photon avalanche diode.

Figure 2:
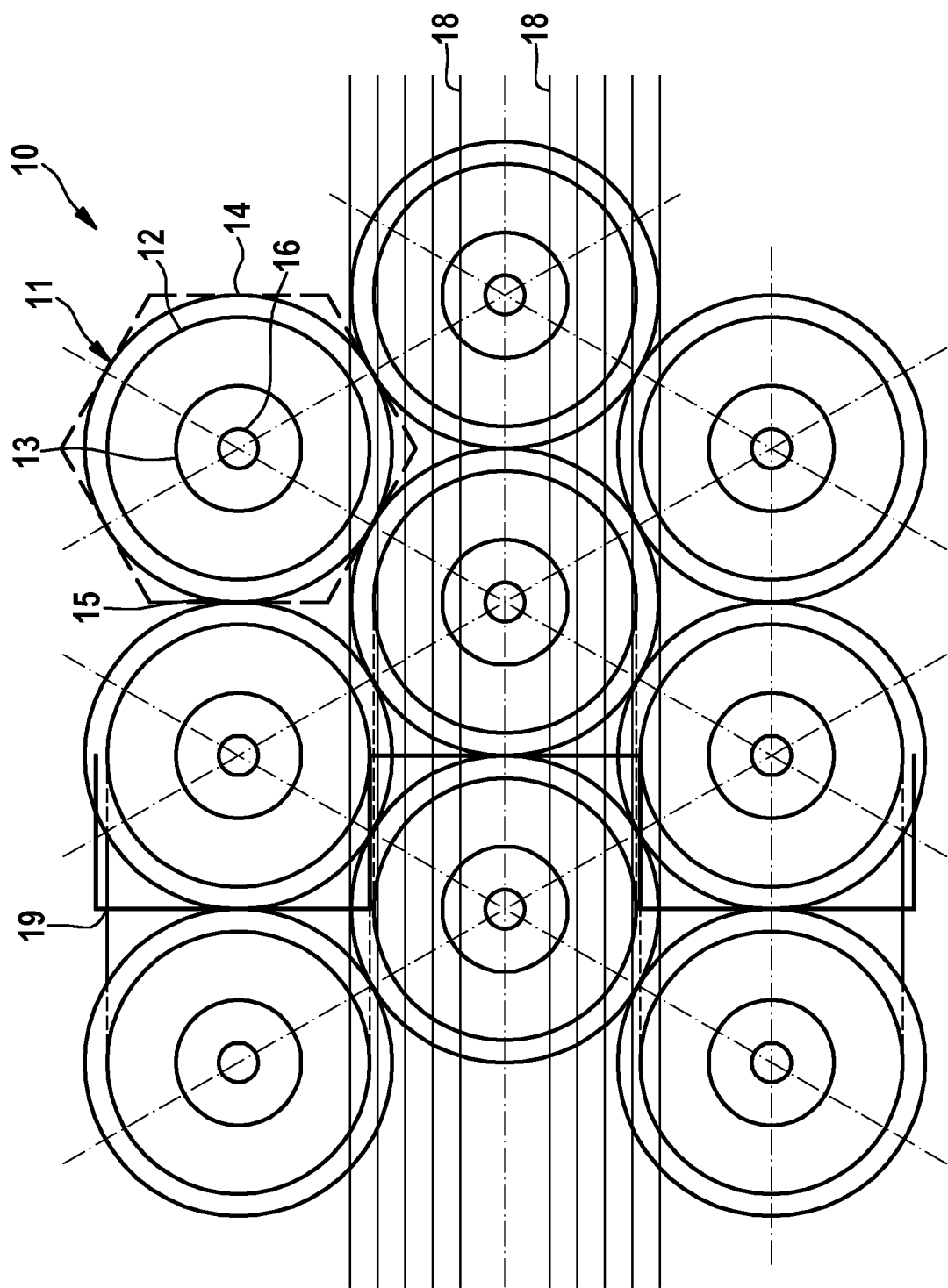
FIG. 2 a top view on the photodetector array according to an embodiment of the present invention.

FIG. 2 shows a top view on an arrangement of photodetector cells 11 of an embodiment of a photodetector array 10. The photodetector cells 11 are arranged in a semiconductor substrate as known in the art. The photodetector cells 11 each form a pixel of the photodetector array 10 and comprise single-photon avalanche diodes (SPAD) 12. The photodetector cells 11 are arranged in a hexagonal grid and therefore have a staggered arrangement which allows to compact the photodetector cells 11 with its small active areas 13 arranged in the center of the photodetector cells 11.

Particularly, the portion of the active area 13 of the photodetector cells compared to the area of the photodetector cell 11 is between 5 to 33%. This allows a larger distance between the active areas 13 of the photodetector cells so that the cross-talk between active areas 13 of neighboring photodetector cells 11 can be kept quite low.

Further, the relatively small active area 13 is beneficial as the photodiode capacitance and the charge flow through the photodiodes is significantly reduced.

The reduction of the photodiode active area 13 requires a large recovery of the fill factor by means of microlenses 14 for each of the photodiodes to maintain or to increase the sensitivity of the photodetector cells 11 of the photodetector array 10. The microlenses 14 may be formed as a single microlens layer on top of the semiconductor substrate. The area of light focused by the microlenses 14 which lies within the active area 13 is indicated by 16.

FIG. 2 shows the arrangement of the photodiodes with a circular active area 13 in a total photodetector cell area which is hexagonal or circular wherein on top of each of the photodetector cells 11 a microlens 14 is arranged. The microlenses 14 therefore also have a staggered arrangement corresponding to the arrangement of the photodetector cells 11. In difference to the active areas 13 of the photodetector cells 11, the microlenses 14 do not need to have to suppress optical or electrical interference. Therefore, none or only a small gap 15 between neighboring microlenses 14 may be provided.

Figure 3A:
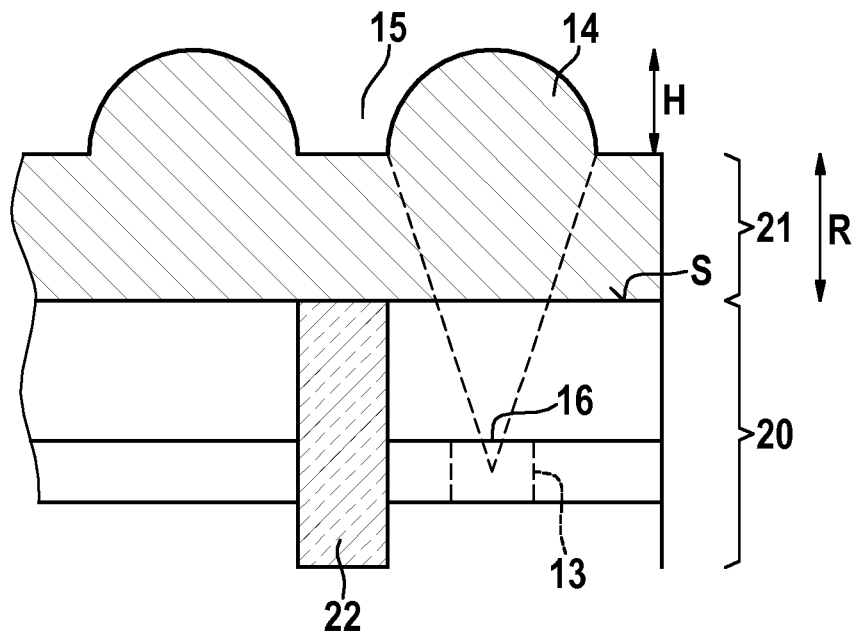
FIGS. 3a and 3b cross-sectional views of two adjacent pixels with deep-trench isolation between the photodetector cells according to alternative embodiments.
Figure 3B:
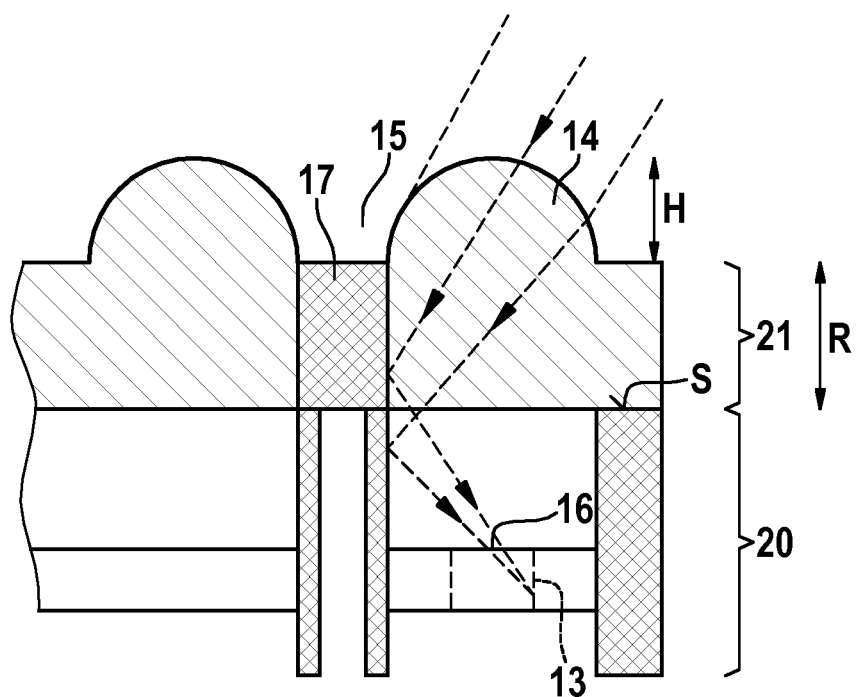

In FIGS. 3a and 3b, cross-sectional views of two embodiments for the arrangement of two neighboring photodetector cells 11 are shown. The arrangement shows two neighboring photodetector cells 11 with its semiconductor depletion region divided by a deep-trench isolation 22 in between. On the surface S of the semiconductor substrate 20, a microlens array 21 is formed having a residual height R with a dome-shaped microlens 14 on top having a sag height H and being distanced from neighboring dome-shaped microlens 14 by the gap 15. This allows to form a focusing microlens 14 which collects and directs incoming photons onto the active area of the respective photodetector cell 11 underneath.

FIG. 3b shows a similar design, wherein between the microlenses 14 a reflective material 17 is included. Furthermore, the deep-trench isolation 22 may be made by a reflective material so that incoming photons may be reflected once or several times on the sidewalls formed by the reflective material.

Figure 4A:
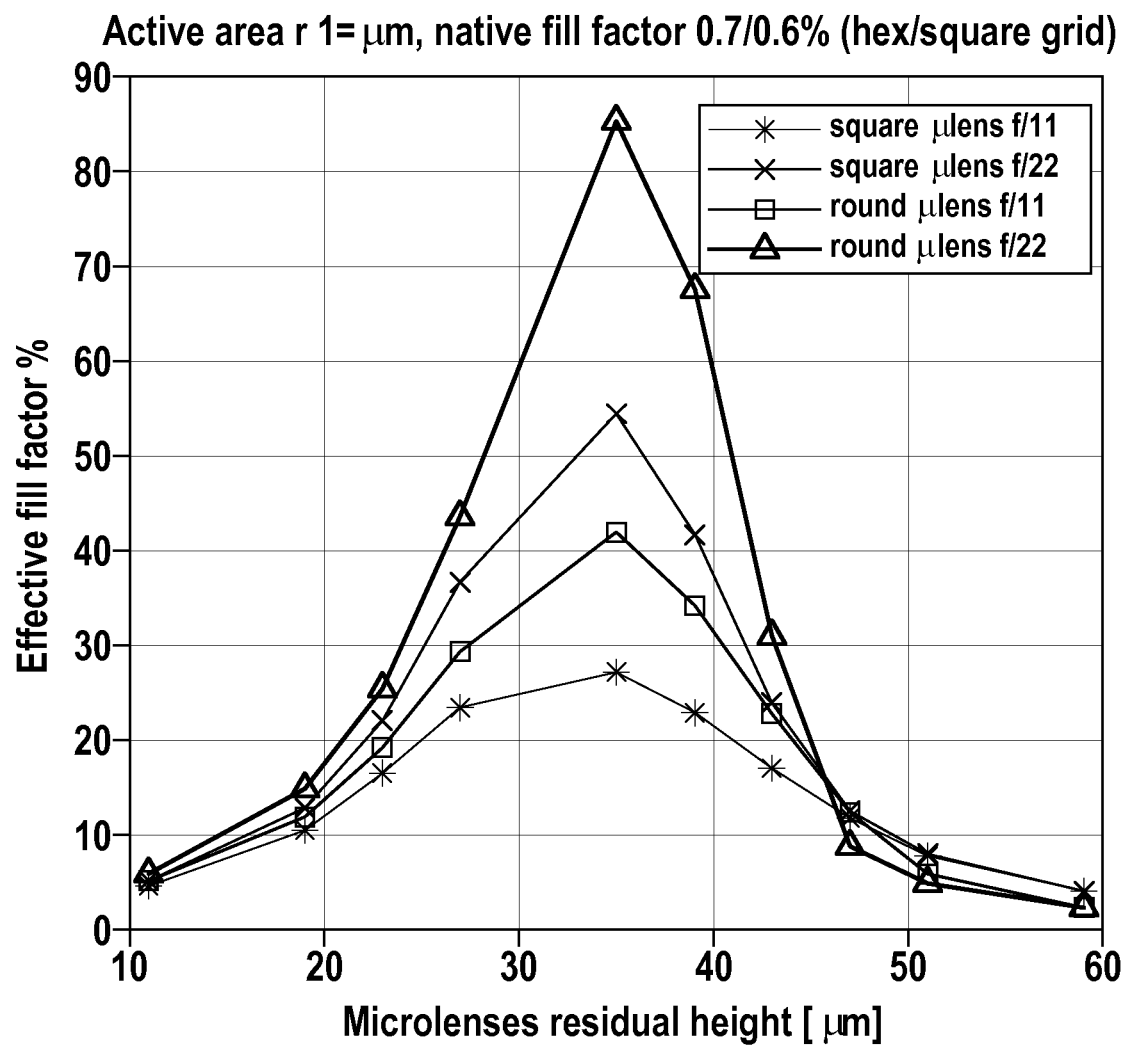
FIGS. 4a-4c simulation results for effective fill factors with square and circular microlenses for different sizes of active areas.

FIG. 4a shows the effective fill factors for circular and square microlenses used with pixels with 1 μm active area radius and a native fill factor of 0.7% and 0.6% for a hexagonal and square grid of pixels, respectively. One can observe a much higher effective fill factor for circular microlenses on a hexagonal grid when compared to the square microlenses on a square grid. FIG. 4a shows the curves for two f numbers indicating different collimation of incident light.

Figure 4B:
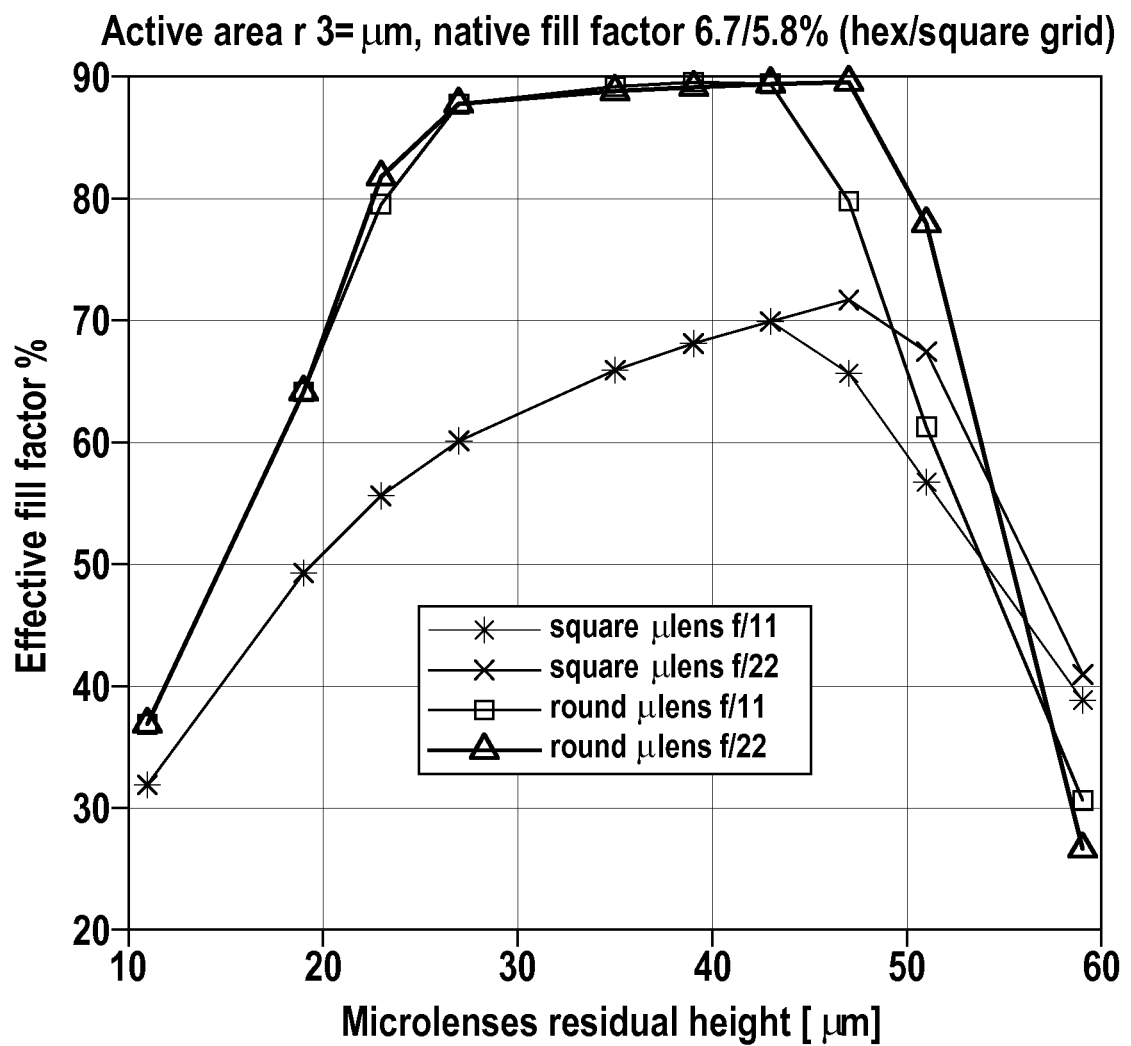

FIG. 4b shows the effective fill factors for circular and square microlenses used with pixels with 3 μm active area radius and a native fill factor of 6.7% and 5.8% for a hexagonal and square grid of pixels, respectively.

Figure 4C:
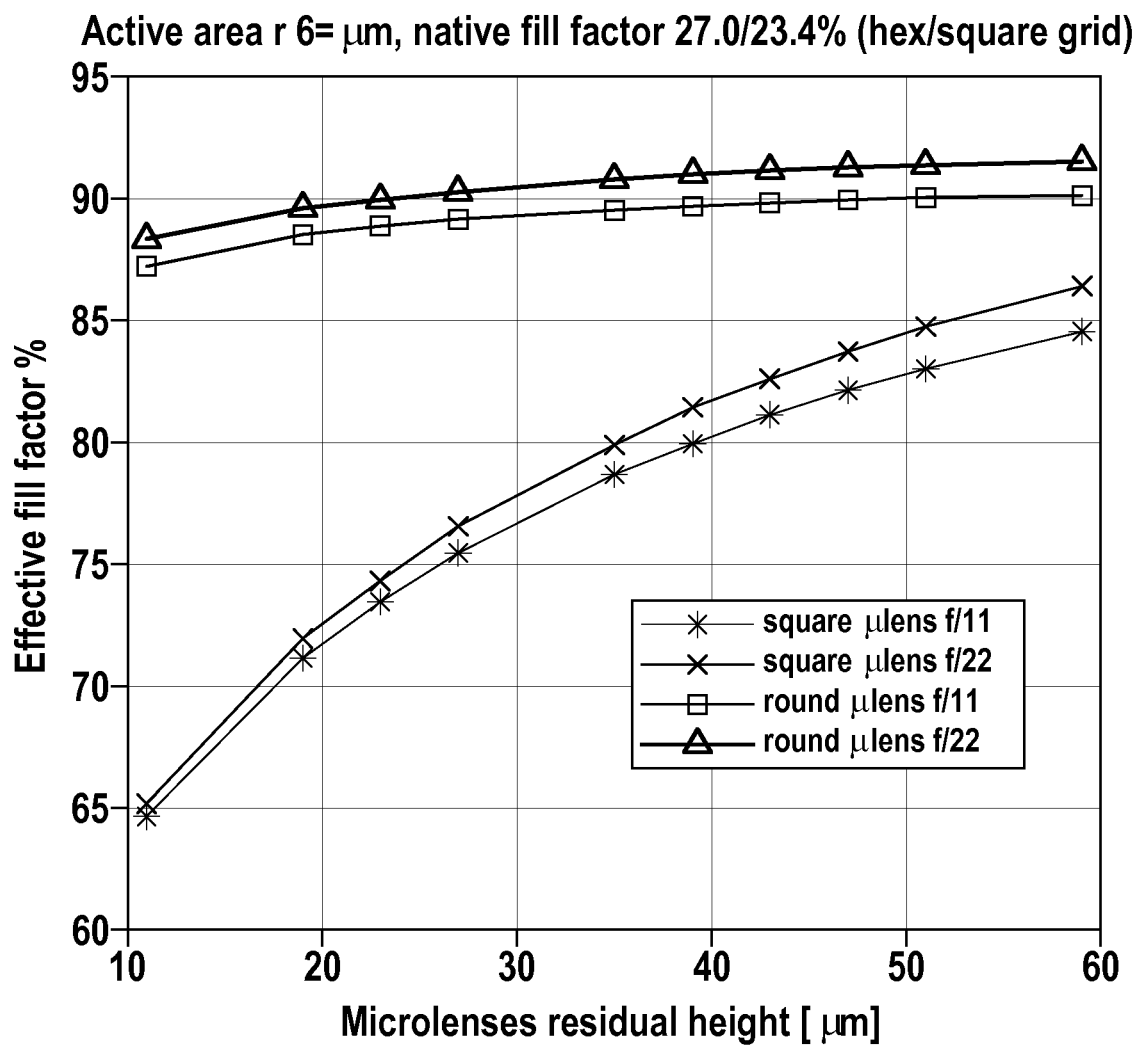

FIG. 4c shows the effective fill factors for circular and square microlenses used with pixels with 6 μm active area radius and a native fill factor of 27% and 23.4% for a hexagonal and square grid of pixels, respectively.

As it is clear from FIG. 4b and FIG. 4c, the circular microlens on a hexagonal grid is also more robust to variations in microlens residual height. An active area radius of less than 3 μm is not desirable due to lateral shifts of microlenses with respect to the photodetector substrate. Lateral shifts decrease the robustness to microlens residual height variations.

The staggered arrangement of circular microlenses yields for a fill factor of 90.6% compared to a fill factor of 100% of squared microlenses of a rectangular arrangement. However, the photon loss of the rectangular-shaped microlenses is high, so that the staggered arrangement of circular or hexagonal microlenses 14 effectively directs more photons onto the active area 13 of the photodetector cell 11 than rectangular-shaped microlenses. Furthermore, circular or hexagonal microlenses turned out to be more robust with respect to lateral shifts and variations in microlens residual height R occurring in the microlens production, as clear from FIG. 4.

The photodetector active area 13 is provided with a circular shape which may reduce the edge electrical field compared to squared active areas. Preferably, the radius of the active area 13 of the photodetector cell 11 is smaller than 9 μm, more preferred smaller than 5 μm. The smaller the active area 13 is, the lower is the chance to capture impurities in the semiconductor material which further reduces the count of noisy pixels.

In contrast thereto, the size of the active area 13 of the photodetector cell should be not smaller than 3 μm due to a lateral shift variations for the placement of microlenses on top of the photodetector array 10 as well as due to microlens residual height variations.

The substantial area difference between the active area 13 and the photodetector cell 11 allows to accommodate the pixel electronics around the active area 13 which is composed of a quenching transistor, a gate for capacitive isolation of the photodiode, an active recharge mechanism and a photodiode disabling memory. The gate for capacitive isolation of the photodiode allows to have a capacitive isolation to reduce the cross-talk and after-pulsing due to a smaller amount of charge flowing through the photodiode. The quenching transistor and the gate for capacitive isolation need to be positioned as close as possible to the photodiode output contact so that the connections do not increase the capacitance significantly. The electronics for active recharge mechanism and a photodiode disabling memory can be placed farther away from the photodiode output contact since an increased capacitance do not affect the performance greatly.

As further shown in FIG. 2, the metal connections extend in a rectangular fashion between the substrate surface and the microlens layer. The read out lines 18 run along straight lines along the arrangement direction of the photodetector cells 11 between two neighboring rows of photodetector cells 11, respectively. The power lines 19 substantially extend perpendicular to the read out lines but are guided in a serpentine way around the active areas 13 of the photodetector cells 11.

Since high-performance applications require to read all photodetector signals in parallel within a small integration time and without delays between the read-outs of the individual photodiodes, each photodiode needs to have a single connection to the outside of the array. These connections should be as short as possible to enable high-speed and low-jitter data transmission so that read out lines 18 are used for the photodiode outputs, while the serpentine power lines 19 are used for the power supply of the photodetector cells 11.

The invention claimed is:

1. A microscopic system with an optical system and a photodetector array for capturing image data, wherein the photodetector array comprises:
    photodetector cells arranged on a substrate, each including a single-photon avalanche diode, wherein the active areas of the photodetector cells are neighbored along a hexagonal grid;
    microlenses, having a hexagonal or circular shape, each arranged on one photodetector cell to focus light onto the photodiode;
    wherein at least one of the microlenses has a circular shape, wherein the radius of the microlens is by a factor of 3 to 20 larger than the radius of the active area of the photodiode.

2. Photodetector array according to claim 1, wherein the active area of the photodiode has a circular shape.

3. Photodetector array according to claim 1, wherein particularly the radius of the active area is lower than 9 μm, preferably lower than 5 μm, wherein particularly the radius of the active area is more than 3 μm.

4. Photodetector array according to claim 1, wherein the active area of the photodiode is configured with an area of 5-33% of the whole photodiode area.

5. Photodetector array according to claim 1, wherein the microlenses are printed on the substrate with a ratio between a sag height and a residual height of between 0.05 and 0.9.

6. Photodetector array according to claim 1, wherein each of the photodetector cells is coupled with an individual read-out line for reading out a pixel data.

7. Photodetector array according to claim 6, wherein the read-out lines are arranged straight along an arrangement direction of the photodetector cells between neighboring rows of photodetector cells.

8. Photodetector array according to claim 7, wherein the power lines extend perpendicular to the read-out lines and run in a serpentine manner around the active areas of the photodetector cells.

9. Microscopic system according to claim 1, which uses an image scanning microscopy approach.

10. Microscopic system according to claim 9, which places the photodetector array at a pinhole plane of the microscopic system.

\* \* \* \* \*